(12) United States Patent
Tichauer

(10) Patent No.: US 6,784,744 B2
(45) Date of Patent: Aug. 31, 2004

(54) AMPLIFIER CIRCUITS AND METHODS

(75) Inventor: Larry Martin Tichauer, La Palma, CA (US)

(73) Assignee: PowerQ Technologies, Inc., Newport Beach, CA (US)

( * ) Notice: Subject to any disclaimer, the term of this patent is extended or adjusted under 35 U.S.C. 154(b) by 0 days.

(21) Appl. No.: 10/259,222

(22) Filed: Sep. 26, 2002

(65) Prior Publication Data

US 2003/0076172 A1 Apr. 24, 2003

Related U.S. Application Data

(60) Provisional application No. 60/325,898, filed on Sep. 27, 2001.

(51) Int. Cl.[7] ................................................. H03G 3/10
(52) U.S. Cl. ..................... 330/285; 330/129; 327/534
(58) Field of Search .......................... 330/285, 2, 129, 330/307, 300; 327/534, 537, 546, 566, 389, 434

(56) References Cited

U.S. PATENT DOCUMENTS

| | | |
|---|---|---|
| 5,017,811 A | 5/1991 | Worley |
| 5,081,371 A | 1/1992 | Wong |
| 5,119,042 A | 6/1992 | Crampton et al. |
| 5,206,544 A | 4/1993 | Chen et al. |
| 5,287,555 A | 2/1994 | Wilson et al. |
| 5,397,934 A | 3/1995 | Merrill et al. |
| 5,510,747 A | 4/1996 | Williams |
| 5,559,368 A * | 9/1996 | Hu et al. .................... 257/369 |
| 5,602,790 A | 2/1997 | Mullarkey |
| 5,610,533 A | 3/1997 | Arimoto et al. |
| 5,612,566 A | 3/1997 | Williams |
| 5,689,144 A * | 11/1997 | Williams .................... 307/130 |
| 5,748,016 A | 5/1998 | Kurosawa |
| 5,753,955 A | 5/1998 | Fechner |
| 5,767,733 A | 6/1998 | Grugett |
| 5,942,940 A | 8/1999 | Dreps et al. |
| 5,946,243 A | 8/1999 | Sim |
| 6,049,496 A | 4/2000 | Forbes et al. |
| 6,140,877 A | 10/2000 | Forbes |
| 6,213,869 B1 * | 4/2001 | Yu et al. .................... 438/189 |
| 6,225,846 B1 | 5/2001 | Wada et al. |
| 6,225,852 B1 | 5/2001 | Cleveland et al. |
| 6,232,793 B1 | 5/2001 | Arimoto et al. |
| 6,362,690 B1 | 3/2002 | Tichauer |
| 6,509,589 B1 | 1/2003 | Tichauer et al. |
| 6,597,898 B1 | 7/2003 | Iwata et al. |

* cited by examiner

*Primary Examiner*—Henry Choe
(74) *Attorney, Agent, or Firm*—Townsend and Townsend and Crew LLP

(57) ABSTRACT

Embodiments of the present invention provide an amplifier circuit and method that can be used to save power or reduce distortion in an electronic system, such as a wireless communication system. In one embodiment, the present invention includes an amplifier circuit comprising a transistor having a gate terminal, drain terminal, body terminal, and a load. An input signal has different signal envelopes during different time periods. A control signal coupled to the body terminal is used to change the voltage on the body terminal when the input receives different envelopes. Accordingly, the amplifier can be biased to use less power when lower envelopes are being received. Electronic systems, such as wireless communication systems, can realize advantageous performance enhancements by utilizing the amplifier and other techniques employed by embodiments of the present invention.

45 Claims, 15 Drawing Sheets

AMPLIFIER CIRCUITS AND METHODS

This application claims the benefit of provisional application No. 60/325,898 filed on Sep. 27, 2001.

BACKGROUND

The present invention relates to electronic circuits and systems, and more particularly, to electronic circuits and systems including amplifier circuits and methods of operating the amplifier circuits.

Amplifier circuits and methods find many applications in electronic systems. For example, amplifier circuits are widely used in wireless communication devices such as pagers, cellular phones, or cellular base stations to process various analog signals within the system. The function of an amplifier is to increase the power, voltage, or current of signals received at the amplifiers input or inputs. One common application of an amplifier circuit is for transmission of a Radio Frequency (RF) signal. For example, many wireless communication systems require a power amplifier to drive the antenna of the system, thereby transmitting information contained in the amplified signals into the airwaves.

FIG. 1 illustrates a conventional MOSFET RF amplifier 100 for amplifying the power of an RF signal. The amplifier circuit 100 includes an input matching network 110, a MOS transistor 120, a load 130, a bias network 140, and an output matching network 150. The bias network includes a pair of resistors 141 and 142 connected in series between a fixed bias voltage $+V_B$ and the gate of MOS transistor 120. The first terminal of a capacitor 143 is connected to the node between resistors 141 and 142, and the second terminal of the capacitor 143 is connected to ground.

FIG. 2 illustrates a conventional N-channel MOS transistor structure 200 that may be used in the amplifier circuit of FIG. 1. MOS transistor 200 includes a body region comprising a P-type substrate 210, a N-type source region 221, a gate 230, and an N-type drain region comprising N− region 242 and N+ region 241. The drain, source, and body regions include electrical contacts 240, 220, and 250, respectively. In typical amplifier designs using MOS or equivalent devices, the body is electrically connected to the source. A common technique for establishing the source to body connection is a polysilicon connection 260 between the source contact 220 and body contact 250. Thus, in typical amplifier designs, the body is maintained at the same voltage as the source.

The circuit shown in FIG. 1 is representative of a single MOSFET amplifier stage. This can be considered a single ended stage or half of a balanced stage. Load 130 may comprise an inductor, shown as jωL1, which may have a high impedance at the circuit's frequency of operation. As is the case with inductors, any sudden change in current will cause a voltage of opposite polarity to be generated. The magnitude of this voltage will be proportional to di/dt.

Also shown in FIG. 1 is an input signal 101. Input signal 101 includes a first amplitude signal portion defining a first signal envelope 102, and a brief large amplitude pulse portion defining a second signal envelope 103. Such signals may be common in a variety of electronic systems. For example, in a wireless communication system, such signals may occur when the various wavelengths in an encoded signal constructively interfere. Signals including brief pulse envelopes are problematic to amplifiers because, typically, the amplifier is biased to handle the smaller envelope 102. Thus, the bias current drawn by amplifier circuit 100 will be primarily determined by the smaller constant amplitude signal. However, when a large amplitude pulse is received, there will be a definite di/dt present across the inductor. The magnitude of the di/dt will depend on the slope of the large amplitude pulse. A large slope will typically cause a large voltage to appear across the inductor, and thus, the output of the amplifier will clip at the supply voltage. Accordingly, any information carried in the input signal 101 may be lost or severely distorted.

Another problem with conventional amplifier circuits and methods is that various electronic system applications, such as wireless communication systems, for example, have an ever increasing requirement that the amplifiers include more functionality and improved performance. For example, electronic systems may require amplifier circuits or methods that have variable gains, wide bandwidths, process or temperature compensation, improved linearity, or power efficiency.

Accordingly, amplifier circuits and methods that have improved performance and increased functionality are desirable for modern electronic systems.

SUMMARY

Embodiments of the present invention provide an amplifier circuit and method that can be used to save power in an electronic system. In one embodiment, the present invention includes an amplifier circuit comprising a transistor having a gate terminal, drain terminal, and body terminal, a load coupled to the drain terminal of the transistor, an input signal coupled to the gate terminal, the input signal including a first signal envelope during a first time period and a second signal envelope during a second time period, a control signal coupled to the body terminal, the control signal including a first signal portion that sets a first voltage on the body terminal and a second signal portion that sets a second voltage on the body terminal, wherein the control signal is synchronized in time with the input signal so that the first signal portion occurs during to the first signal envelope, and the second signal portion occurs during to the second signal envelope.

In another embodiment, the present invention includes an amplifier circuit comprising an amplifier input terminal for receiving an input signal, a transistor having a gate terminal, drain terminal, and body terminal, the gate terminal being coupled to the amplifier input terminal, a load coupled to the drain terminal of the transistor, a body conditioning circuit having an input coupled to the amplifier input terminal and an output coupled to the body terminal of the transistor, the body conditioning circuit including a threshold detector to detect an envelope of the input signal and generate a control signal to change the bias current in the amplifier in response to changes in the envelope of the input signal.

In another embodiment, the present invention includes a method of controlling an amplifier comprising receiving an input signal at the gate terminal of at least one MOS transistor, the input signal including a first signal envelope during a first time period and a second signal envelope during a second time period, receiving a control signal at the body terminal of the at least one MOS transistor, the control signal including a first signal portion that sets a first voltage on the body terminal and a second signal portion that sets a second voltage on the body terminal, wherein the control signal is synchronized in time with the input signal so that the first signal portion corresponds to the first signal envelope, and the second signal portion corresponds to the second signal envelope.

In one embodiment, the present invention provides an apparatus and method for use in a wireless communications system. For example, in one embodiment, the present invention provides a wireless communication system comprising a baseband processor for encoding a communication signal, a modulator coupled to the baseband processor for receiving the encoded communication signal and generating an RF signal, an RF amplifier coupled to the modulator for receiving the RF signal, the RF amplifier comprising a field effect transistor and a load, and a body modulation circuit having an input for receiving the encoded communication signal and an output coupled to a body terminal of the transistor.

In another embodiment, the present invention provides a method of transmitting a signal for use in a wireless communication system, the method comprising encoding a signal in a baseband processor, modulating the encoded signal to produce an RF signal, and amplifying the signal in an RF amplifier, the amplifier including a transistor and a load, wherein, when the RF signal has a first envelope, a body terminal of the transistor is biased to a first voltage, and when the RF signal has a second envelope, the body terminal of the field effect transistor is biased to a second voltage.

In another embodiment, the present invention includes a method of controlling the transmission of a signal comprising sensing the amplitude of a signal to be transmitted, generating a control signal indicating that the amplitude of the signal to be transmitted has changed, receiving the signal to be transmitted at the gate of at least one transistor, and changing the body voltage of the transistor from a first voltage to a second voltage. Sensing of the amplitude may performed using a detector, such as an analog detector or digital detector.

A further understanding of the nature and advantages of the present invention may be realized by reference to the remaining portions of the specification and the drawings.

DETAILED DESCRIPTION

Embodiments of the present invention take advantage of the device physics of MOS and equivalent transistor structures to improve the functionality and performance of amplifier circuits, as well as the electronic systems in which such amplifier circuits are used. Additionally, some embodiments of the present invention provide techniques and configurations for amplifier circuits, and electronic elements coupled to the amplifier circuits, that may be used to improve signal processing in electronic systems such as wireless communication systems.

Figure 1:
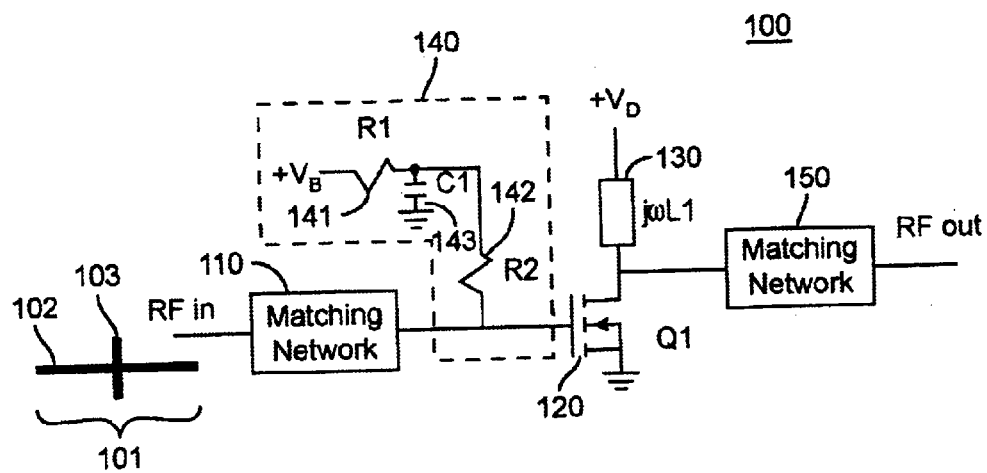
FIG. 1 illustrates a conventional MOS amplifier.
Figure 2:
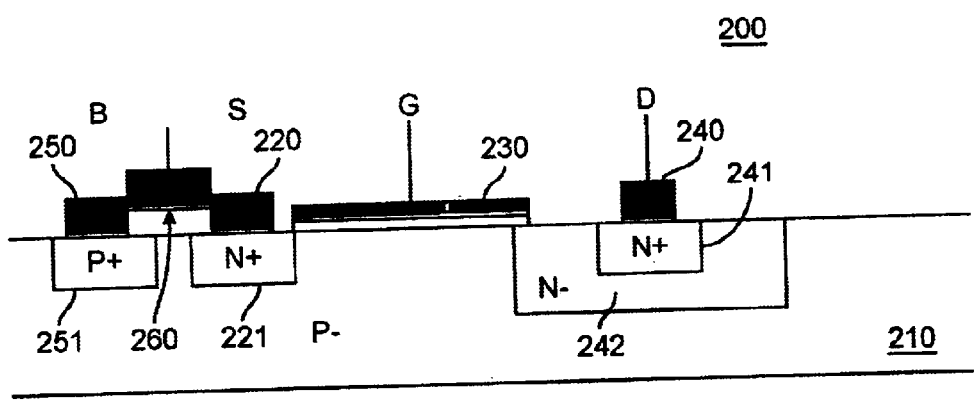
FIG. 2 illustrates a conventional MOS transistor structure.
Figure 3A:
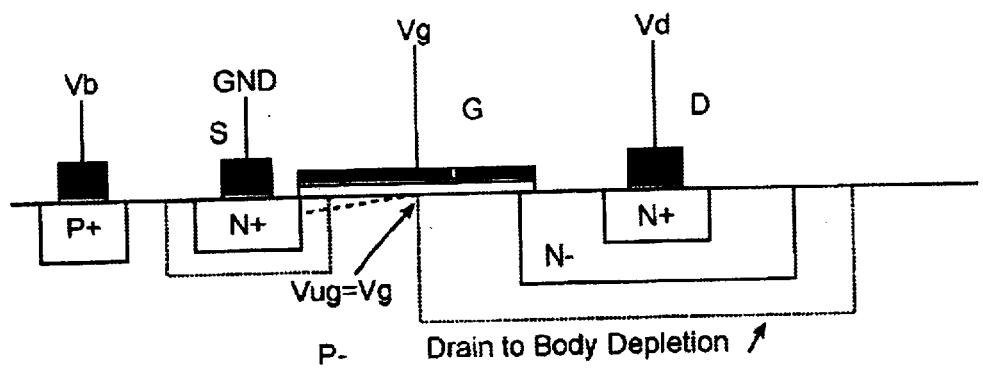
FIG. 3A illustrates a MOS transistor structure according to one embodiment of the present invention.

FIG. 3A illustrates a MOS transistor structure 300 according to one embodiment of the present invention. In MOS transistor structure 300, the body is no longer tied to the source. It is now capable of being biased to any voltage chosen by the designer. A dangerous situation may exist if the body potential ever exceeds the source potential. In this case the body to source diode would be forward biased and device performance will be degraded. It is also very important to make sure that any transient condition that may exist across the flyback diode found between the body and the drain have a low impedance path to ground.

The gate threshold voltage of the MOSFET is determined, to a large degree, by the source to body junction's characteristics. This is a complex function of doping profiles and parasitic resistance just to name a few factors. The threshold voltage can also be controlled by varying the body voltage. This effectively changes the depletion width of the source to body junction.

One characteristic of the I-V curve of a typical MOSFET is that at low gate to source bias the slope in the linear region is shallower, i.e., higher resistance than the traces for higher gate to source voltages. As can be seen in FIG. 3A, the conduction channel extends from the source to the edge of the drain to body depletion. The point at which these two regions intersect is where the voltage under the gate, Vug, which results from the current flowing in the channel multiplied by the resistance of the conduction region, equals the gate potential. This is because at this point, the voltage differential across an infinitely narrow section of the gate oxide is zero. At the source end of the conduction channel, the largest accumulation of charge will exist because, with the source at ground potential, the full potential of Vg is across that infinitely narrow section of the gate oxide. After this point there is current flow and a resultant voltage drop which means that a lesser amount of charge will accumulate in each ensuing infinitely narrow section.

Additionally, the drain to body depletion is determined by the drain potential and the body potential everywhere except at the immediate region of the interface between the oxide and the body. Only within the 50 to 100 angstroms of the semiconductor interface, where the conductive channel exists, is the voltage across the depletion equal to the drain voltage minus the gate voltage. At higher gate voltages the potential difference will be less than for a lower gate voltage. Additionally, for lower gate to source voltages the channel resistance is higher in the linear region where the drain to source voltage is low. This correlates with the fact that the transconductance is lower at the lower gate to source voltages in the saturated region than at the higher gate to source voltages.

The voltage under the gate at the point where the conduction region meets the drain depletion region is independent of the body bias voltage. However, the shape and subsequent composite resistance of the conduction region under the gate is dependent on the body voltage since the body bias voltage affects the threshold voltage. The change in threshold voltage has a relationship approximated by:

$$\Delta V_{th} \alpha (\Delta Vbs)^{1/n}$$

Where n is a function of doping and Vbs is the body to source voltage. Since the source is usually highly doped most of the depletion will take place on the lighter doped body side of the junction. Additionally, the drain current Id is a well know function of $V_{th}$. Therefore, the drain current may be changed by controlling the body terminal of a MOS transistor.

It should be noted that the relationship between $\Delta Vbs$ and $\Delta V_{th}$ is not 1:1. Therefore, establishing large changes in $V_{th}$ in order to change the drain current from one desired value to another may require even larger changes in Vbs. This is important because of the reverse breakdown voltage of the source to body diode. Doping concentrations must be taken into consideration when designing a device like this.

However, $V_{th}$ can be modulated by modulating Vbs, thereby modulating the drain current. One powerful advantage of modulating drain current via the body rather than the gate is that the drain to gate capacitance will remain the same regardless of what the body voltage is. This is important in matching the input of the MOSFET. It should be noted that the MOS transistor shown in FIG. 3A is an N-channel MOS transistor. However, P-channel transistors behave in an equivalent manner and may also be used in embodiments of the present invention.

Figure 3B:
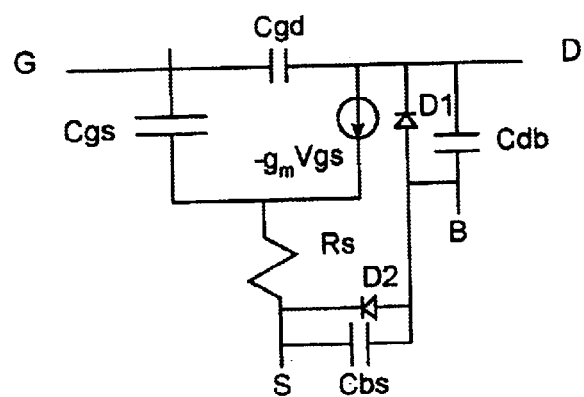
FIG. 3B illustrates an equivalent circuit of the MOS transistor of FIG. 3A according to one embodiment of the present invention.

FIG. 3B illustrates an equivalent circuit of the MOS transistor of FIG. 3A according to one embodiment of the present invention. The gate to drain capacitance is Cgd. This capacitance is primarily due to the portion of the gate oxide over the depleted portion of the conduction channel. Conversely, Cgs is the portion of the gate oxide over the undepleted portion of the induced conduction channel. Rs is the undepleted induced channel's resistance plus the contact resistance of the source metalization as well as any residual resistance in the highly doped region between the source metalization and the induced channel. For the most part this corresponds to the classical MOSFET equivalent circuit where $-g_m Vgs$ is the transconductance of the MOSFET. Cdb, the drain to body capacitance, is a first order body modulated FET variable. In the conventional MOSFET, Cdb is referred to as Cds since the body is shorted to the source. Additionally, there is a diode present between the body and the source. This diode and its junction capacitance, D2 and Cbs respectively, are usually shorted out when the body is connected directly to the source.

Figure 4A:
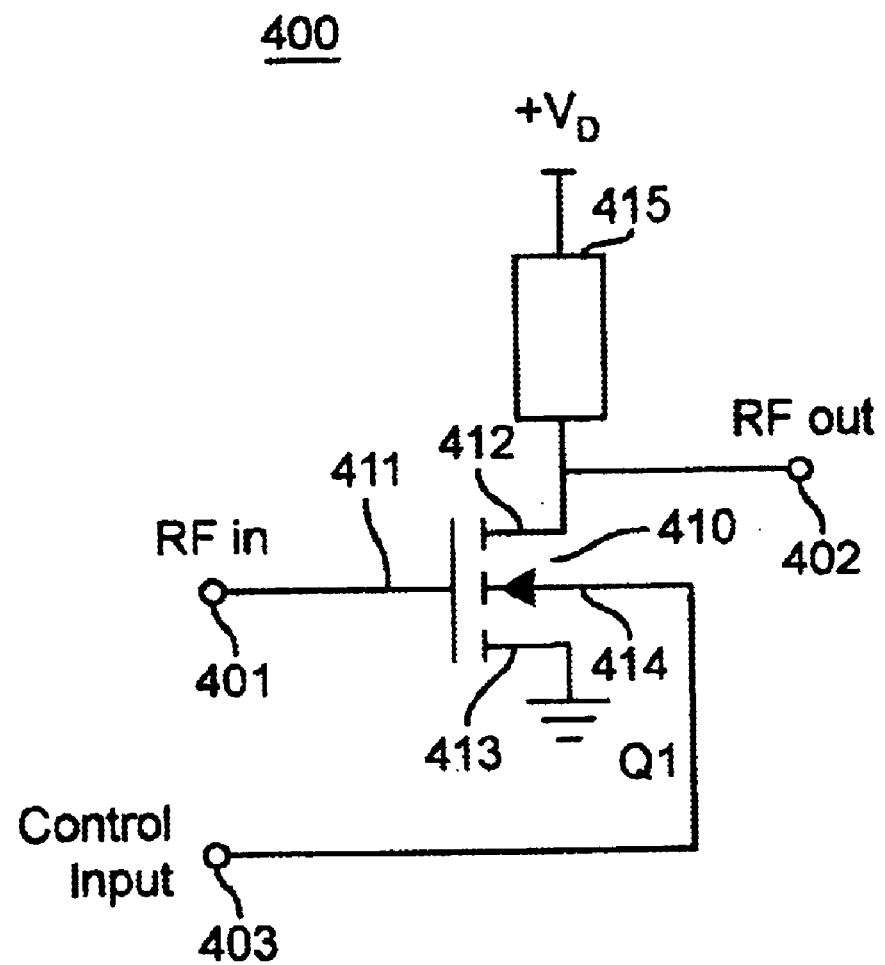
FIG. 4A illustrates an amplifier circuit according to one embodiment of the present invention.

FIG. 4A illustrates an amplifier circuit 400 according to one embodiment of the present invention. Amplifier 400 is a single ended stage, but a balanced configuration may be used in other embodiments discussed in more detail below. Consequently, the configuration of FIG. 4A is illustrative of only one possible embodiment. Amplifier 400 includes MOS transistor 410 and a load 415. MOS transistor 410 includes a gate terminal 411, drain terminal 412, source terminal 413, and body terminal 414. Gate terminal 411 is coupled to amplifier input terminal 401 ("RFin"). Drain terminal 412 of MOS transistor 410 is coupled to load 415 and output terminal 402 ("RFout"), which forms the output of amplifier 400. Load 415 may form a complex load impedance $Z(j\omega)$ typically including inductance, such as an inductor L (e.g., $Z(j\omega) = -j\omega L$), for example. Another terminal of load 415 may be coupled to power supply +V.

The present invention provides a separate body terminal 414 of MOS transistor 410 coupled to a control input 403 that receives a body bias control signal. The control signal changes the body voltage of MOS transistor 410, and consequently the bias current of amplifier 400, in accordance with the input signal received at gate terminal 411. According to different embodiments, the bias current may be modified in different ways depending on the input signal. For example, in one embodiment, when there is no input signal, the control signal may be set to a voltage to reduce or completely shut off the bias current, and when there is an input signal, the control signal is set to a voltage to increase the voltage on body terminal 414 so that there is sufficient bias current in amplifier 400 to process the signal. In another embodiment, if the amplifier 400 receives envelopes with different maximum voltages, the control signal may be set to reduce the bias current when lower voltage envelopes are received, and the control signal may be set to increase the bias current when higher voltage envelopes are received. Accordingly, amplifier 400 has a lower or reduced bias current when the envelope of the input signal is low or off and a larger bias current when the envelope of the input signal is high (e.g., when a pulse occurs).

Figure 4B:
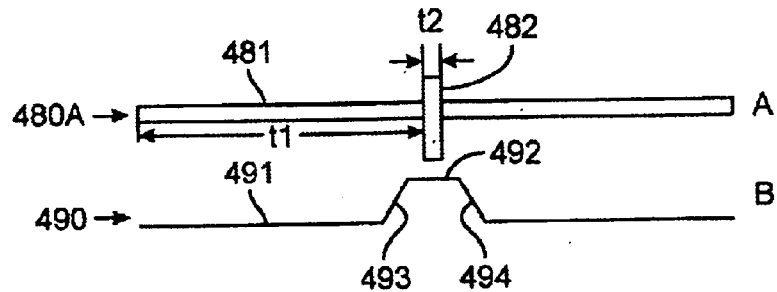
FIG. 4B illustrates an input signal received at the gate terminal of an MOS transistor and a corresponding control signal received at the control input.

FIG. 4B illustrates the parts of an input signal 480A received at gate terminal 411 of MOS transistor 410 and the corresponding parts of a control signal 490 received at the control input 403. The input signal 480A includes a first signal envelope 481 during a first time period t1 and a larger amplitude portion defining a second signal envelope 482 during a second time period t2. The amplitude of second signal envelope 482 is larger than the first signal envelop 481. Such signals may be common in a variety of electronic systems such as a wireless communication system, for example. Consequently, amplifier 400 requires a larger bias current to process second signal envelope 482 than is required to process first signal envelope 481.

The present invention saves power by adjusting body terminal 414 so that the bias current in amplifier 400 is lower during the smaller first signal envelope 481 of the input signal and larger during the second larger signal envelope 482. Accordingly, control signal 490 includes a first signal portion 491 that sets a first voltage on body terminal 414 sufficiently large to process the first signal envelope 481 of input signal 480A. Control signal 490 also includes a second signal portion 492 having a second voltage sufficiently large to process the second signal envelope 482 on input signal 490. Control signal 490 is synchronized in time with input signal 480A so that first signal portion 491 corresponds to first signal envelope 481 and second signal portion 492 corresponds to second signal envelope 482. For the present embodiment, MOS transistor 410 is an N-channel device. Thus, the second signal portion 492 of control signal 490 is at a more positive voltage than the first signal portion 491. Consequently, the bias current in amplifier 400 is smaller during the first signal envelope 481 of input signal 480A and larger during the second signal envelop 482. As a result of altering the bias current via the body terminal when larger input signal envelopes are received, the average bias current in amplifier 400 is reduced, and less power is consumed.

Control signal 490 illustrates the voltage received at the body of an N-channel device in the amplifier according to one embodiment of the present invention, where the device initially has a lower body voltage present. When the body to source voltage |Vbs| is low, the drain current is higher than when |Vbs| is high. This results from the fact that when control signal 490 is low, the device's gate threshold voltage is larger, thereby causing a lower drain current to flow. Before the appearance of the larger second signal envelope 482 of input signal 480A, the body voltage becomes more positive causing the threshold voltage to decrease, and the drain current, and corresponding Q point of the device, to increase. This allows the device to remain linear during the peak portion of the signal and allow power savings when such large drain currents are not required.

As mentioned above, when load 415 includes an inductor, the voltage across the inductor will be a function of the rate of change of the current through the inductor (i.e., $V_L = -L \, di/dt$). Embodiments of the present invention used with inductive loads may include a control signal 490 wherein the rate of change between voltage levels is low enough that the voltage on the inductor does not cause deleterious effects on the amplifier. Accordingly, in one embodiment, control signal 490 may ramp up to allow the current, Id, to rise in an approximately linear manner at 493, and ramp down to allow the current, Id, to fall in an approximately linear manner at 494. The ramping up and down of the signal allows the circuit to minimize any inductive responses which can cause ringing and therefore nonlinear components to be impressed on the output signal. The slope of the ramp is a function of maximum voltage across the inductor (i.e., L di/dt) that can be tolerated without distorting the output signal, and may change depending on the particular design.

Figure 4C:
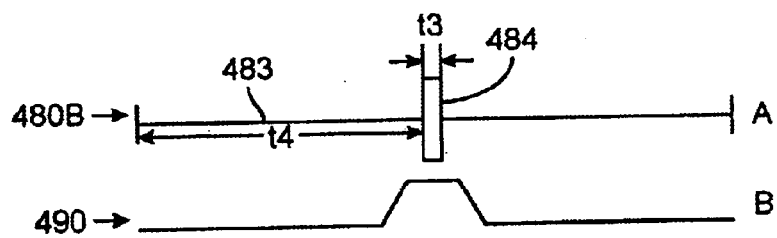
FIG. 4C illustrates another input signal received at the gate terminal of an MOS transistor and a control signal received at the control input.

For some amplifiers data is transmitted in bursts. For example, some of the amplifiers found in cell phones and base stations utilize time-division multiple access transmission techniques. Standards such as IEEE 802.11 require the amplifier to transmit signals in bursts. When the amplifier is not receiving an input, the bias current may represent wasted power. Embodiments of the present invention change the body bias control signal so that the bias current is either reduced to completely shut off when there is no input signal to the amplifier. FIG. 4C illustrates another input signal 480B received at gate terminal 411 of MOS transistor 410 and control signal 490 received at the control input 403. During time period t4, the input signal 480B is off (i.e., zero signal envelope 483). During second time period t3, the input signal is on and forms a first and larger amplitude portion defining a second signal envelope 484. It is to be understood that signal envelope 484 may be time expanded, and further include a first signal envelope 481 (See FIG. 4B) during a first time period t1 and a larger amplitude portion defining a second signal envelope 482 during a second time period t2. Accordingly, control signal 490 may take on multiple levels to establish different bias currents each corresponding to when the signal is off, during a low envelope, or during a large envelope.

Figure 4D:
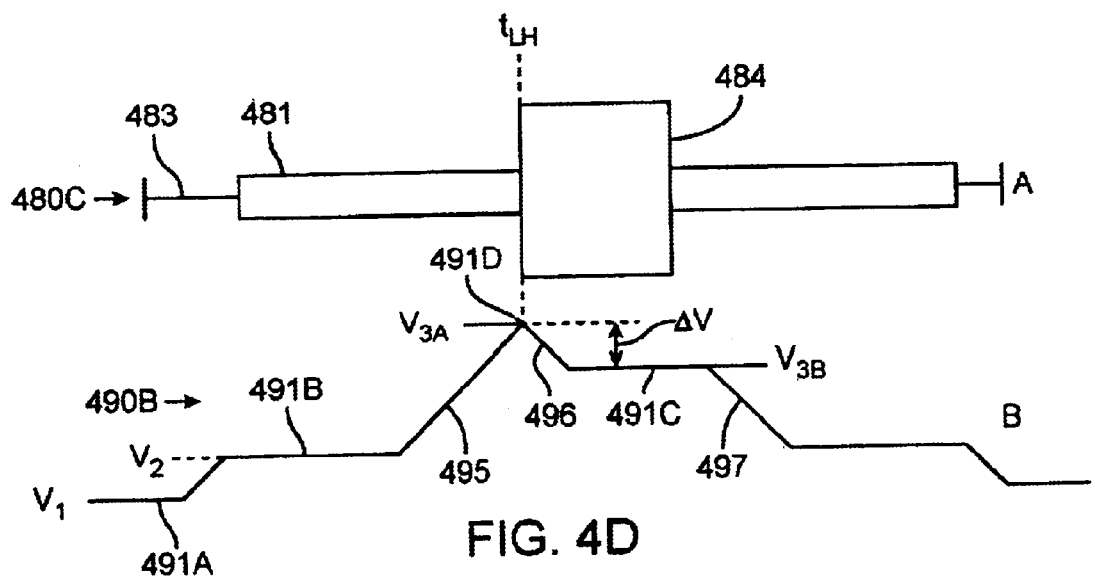
FIG. 4D illustrates an input signal and control signal according to another embodiment of the present invention.

FIG. 4D illustrates the parts of a control signal 490B according to another embodiment of the present invention. Control signal 490B illustrates two additional features of the present invention that may be used separately. The first feature is peak 491D and the second is multiple signal portions for driving the body terminal to multiple levels. Control signal 490B includes a first signal portion 491A, second signal portion 491B, and a third signal portion 491C that includes an overdrive peak 491D. First signal portion 491A sets a first voltage $V_1$ on body terminal 414 that reduces or completely shuts off bias current in amplifier 400 when there is no input signal to amplifier 400. Second signal portion 491B is set to a voltage $V_2$ more positive than $V_1$ just large enough to process the first signal envelope 481 of input signal 480C, but not large enough to process high amplitude pulses on the input signal, thereby saving power. The third signal portion of control signal 490B is set to a voltage $V_{3B}$ sufficiently more positive to process the second signal envelope 484 on input signal 490C.

In one embodiment, the control signal may also include a peak 491D. Peak 491D may be included to precondition an inductive load (e.g., load 415) to deliver current, and may occur approximately synchronous with the change in the envelope as shown in FIG. 4D. For example, if amplifier 400 is operated as the class AB bias range, changes in the input signal envelope level can result in a distorted output signal because an input bias network for setting the gate voltage (See FIGS. 5 and 6 below) requires time to adjust to the new envelope level. In other words, when the input signal transitions from a smaller envelope to a larger envelope, the gate bias network will increase the gate bias voltage, and the time for the gate bias voltage to change depends on the particular values and arrangement of gate bias network components. Before the gate bias voltage has had time to increase in response to an change in the envelope, the bias in the amplifier will be primarily controlled by the voltage at the body terminal. Accordingly, embodiments of the present invention may initially ramp the body terminal voltage to a peak voltage value $V_{3A}$ to set a sufficient amount of bias current in amplifier 400 to reduce distortion. As the gate bias voltage increases, the body terminal voltage may be reduced to $V_{3B}$ because part of the bias current will now be generated by the increased gate bias voltage. It is to be understood that peak 491D could be used in a control signal with only two signal portions at two corresponding voltages. Additionally, such peaks may be generated using analog or digital techniques. For example, the control signal may be a digital waveform generated by a digital-to-analog converter. Alternatively, a variety of analog circuits could be used to generate the control signal, one of which is disclosed below for illustrative purposes.

Embodiments of the present invention may operate as Class A amplifiers during the large envelopes. During such operation, the large envelope current should be set at the peak expected to be drawn. In this way the MOS transistor 410 can current steer the incoming current to achieve a relatively intermodulation product free output. Input and output matching circuitry may also be used, but is not shown.

Figure 5:
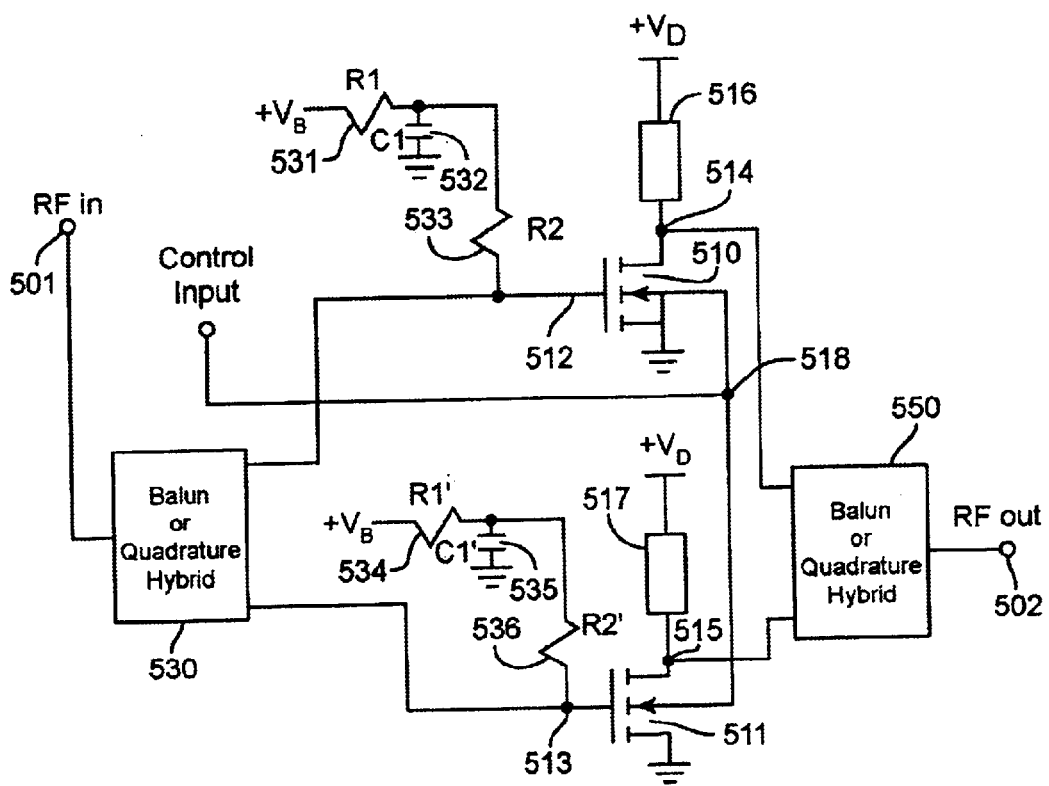
FIG. 5 illustrates an amplifier circuit according to another embodiment of the present invention.

FIG. 5 illustrates an amplifier circuit 500 according to another embodiment of the present invention. Amplifier circuit 500 includes two MOS transistors 510 and 511 having gate terminals 512 and 513, respectively, that are each coupled to amplifier input terminal 501 ("RFin"). The drain terminals 514 and 515 of MOS transistors 510 and 511 are each coupled to loads 516 and 517, respectively. Loads 516 and 517 may form complex loads $Z(j\omega)$ typically including inductance, such as inductors L1 and L2 (e.g., $Z(j\omega)=-j\omega L$), for example. Opposite terminals of loads 516 and 517 may be coupled to power supply +V. Gate terminals 514 and 515 may also be connected to bias circuits. For example, gate terminal 512 may be receive a DC bias from resistor 531 ("R1"), resistor 533 ("R2"), and capacitor 532 ("C1"). Likewise, gate terminal 513 may be receive a DC bias from resistor 534 ("R1'"), resistor 536 ("R2'"), and capacitor 535 ("C1'"). Resistors 531 and 534 are used for filtering with capacitors 532 and 535 for the gate bias, and resistors 533 and 536 are used as isolation resistors between the bypass capacitor and the gate circuitry.

Embodiments of amplifier 500 may also include balanced-unbalanced/quadrature hybrid circuits ("Balun/Quadrature Hybrid") 530 and 550 for providing different phases of the input signal RFin to the gate terminals of transistors 510 and 511. Balanced-unbalanced ("balun") and quadrature hybrid circuits are phase separation circuits that may receive a single input and generate multiple outputs. A balun circuit will present a signal that is in-phase with the input signal at the gate of one FET, and present a signal that is 180 degrees out of phase with input signal at the the gate of the other FET. For a quadrature hybrid, one FET input will be at 0 degrees and the other will be at 90 degrees. Embodiments of a Balun/Quadrature Hybrid may include a transformer having multiple outputs, for example. However, it is to be understood that this is not the only way to achieve this kind of phase shift. There are 180° Hybrid Couplers (i.e., magic-T circuits), R-C networks, L-C networks, and other configurations able to accomplish the same function.

Balun/Quadrature Hybrid 530 is coupled to input terminal 501 for receiving amplifier input signal RFin. Balun/Quadrature Hybrid generates two outputs having different phases as mentioned above. One output is coupled to gate terminal 512 and the other coupled to gate terminal 513. Balun/Quadrature Hybrid 550 is coupled to drain terminals 514 and 515 for providing the recombined amplified signals to amplifier output terminal 502 ("RFout"). Embodiments of the present invention may also include matching networks, but such networks have been excluded from FIG. 5 for illustrative purposes.

Figure 6:
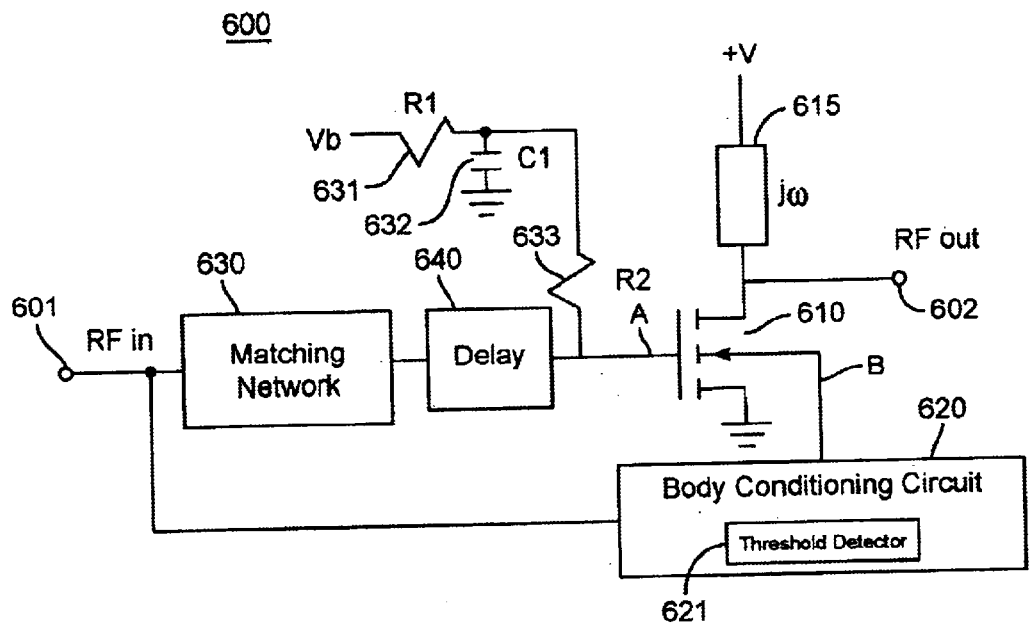
FIG. 6 illustrates an amplifier according to another embodiment of the present invention.

FIG. 6 illustrates an amplifier 600 according to another embodiment of the present invention. Amplifier 600 includes MOS transistor 610 and load 615. Load 615 is coupled between the drain terminal of MOS transistor 610 and power supply +V and may be a complex load $Z(j\omega)$. According to the present embodiment amplifier 600 further includes a gate bias network comprising resistor 631 ("R1"), resistor 633 ("R2"), and capacitor 632 ("C1"), RF matching network 630, delay 640, and body conditioning circuit 620. R1 is used as a filtering capacitor for the gate bias and R2 is used as an isolation resistor between the bypass capacitor and the gate circuitry. The input of body conditioning circuit is coupled to input terminal 601. Body conditioning circuit 620 includes a threshold detector 621 that detects changes in the envelope of the input signal. Body conditioning circuit 620 receives an input signal, and in response thereto, generates a control signal for altering the body voltage of MOS transistor 610, and consequently, the bias current of amplifier 600 when detector 621 detects changes in the envelope of the input signal greater than some predetermined value. The predetermined value can, of course, be set to different levels depending on the application and design. Body conditioning circuit 620 and threshold detection may be implemented using analog circuits, digital circuits, or a combination of analog and digital circuits. While the present embodiment shows an application where the body conditioning circuit input is coupled directly to the amplifier input terminal 601 and receives the input signal, it is to be understood that the input could be connected to other locations in the signal path where information about the input signal is available. For example, in other embodiments the input signal may be a digital or analog signal coupled to other circuits in the system.

Figure 7:
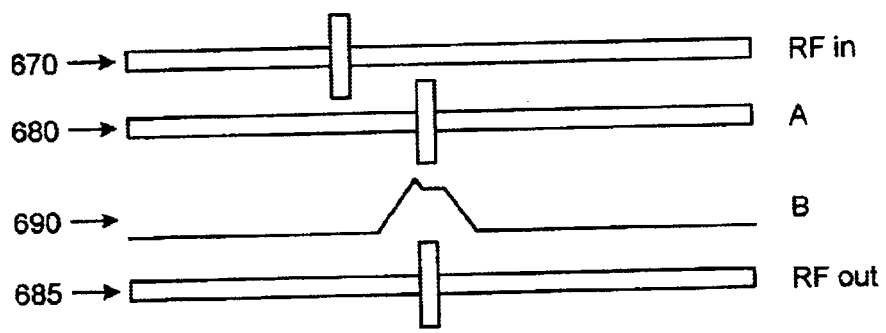
FIG. 7 illustrates the relationship between the different signals processed by amplifiers according to embodiments of the invention.

FIG. 7 illustrates the relationship between the different signals processed by amplifier 600. More particularly, FIG. 7 shows the input signal 670 at the input terminal 601, delayed signal 680 presented to the gate A of transistor 610, control signal 690 generated by body conditioning circuit 620, and output signal 685. Input signal 670 is received at input terminal 601 ("RFin"), and subsequently, at the inputs of delay 640 and body conditioning circuit 620. Matching network 630 may be included for impedance matching. Delay 640 is used to delay input signal 670 for a time period at least sufficient to change the body terminal of transistor 610 between voltages. For example, the input signal may be delayed by an amount of time greater than or about equal to the time required for altering the bias current of the transistor from a first value to a second value. The output of delay 640 is a delayed signal 680, which is a delayed replica of input signal 670. The threshold detector in body conditioning circuit 620 detects a change in the envelope of input signal 670, and generates control signal 690 for adjusting body terminal of MOS transistor 610 so that the bias current in amplifier 600 is lower for smaller input signal envelopes and higher for larger input signal envelopes.

It should be noted that placement of the delay is not critical. However, where the input signal is used to generate the control input to the body conditioning circuit, the input of the body conditioning circuit must be coupled to the signal path upstream from (i.e., before) the delay. On the other hand, the delay does not necessarily have to be placed immediately prior to the body modulated output amplifier. As long as the delay is prior to the output amplifier, it may be placed at any position in the upstream signal path if desired, e.g., the very input of the amplifier chain. This would not be the case if components in the signal path had a non-linear phase response (non-constant group delay) or produced too much group delay (e.g., high Q matching networks or group delay filters). The envelope delay that could be caused by these reactive elements can shift the expected peak's arrival. However, for applications including components with linear phase response or low group delay, the placement of the delay element will not be critical.

Figure 8:
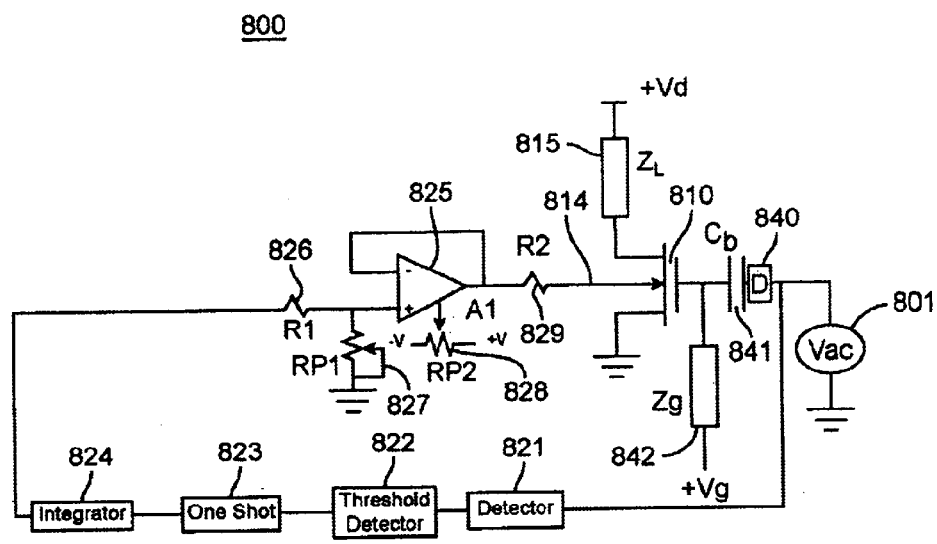
FIG. 8 illustrates an RF amplifier according to another embodiment of the present invention.

FIG. 8 illustrates an amplifier 800 according to another embodiment of the present invention. Amplifier 800 includes MOS transistor 810, load 815 ("$Z_L$"), delay 840, capacitor 841 ("Cb"), and input bias resisitor 842 ("Zg").

The gate of transistor 810 receives an input signal from a source illustrated by Vac 801, which may be an RF signal from a wireless communication system, for example. Delay element 840 is placed in the signal path between the input signal and capacitor 841. However, as mentioned above, the delay may be moved to other locations in the input signal path. Capacitor 841 is a DC blocking capacitor, and bias resistor 842 is a high impedance relative to the source impedance of Vac. The gate of transistor 810 is biased through resistor 842, and $Z_L$ is the load impedance of the circuit. Amplifier 800 further includes detector 821, threshold detector 822, one-shot 823, integrator 824, and intermediate buffer stage 825. Detector 821 may be used to envelope detect the RF input signal to be amplified, which in this case is a sample of Vac. If the input signal crosses a predetermined threshold power level, which can be a dynamic or static level, a one-shot is fired. The duration of the one-shot's pulse is determined based on the characteristics of the large envelope signal. Integrator 824 following one-shot 823 may have a time constant long enough to allow for a gradual rise in the body potential. Integrator 824 controls the ramp characteristics of the control signal, and may be configured according to the requirements of the particular amplifier design. Integrator 824 may also include a buffer amplifier to allow for a low output impedance and isolation for the integrator itself from any circuitry that may follow. The resultant waveform can be distributed as the common body control signal to one or more amplifier stages.

Intermediate stage 825 is coupled between integrator 824 and the body terminal 814 of the transistor 810. Separate body terminal 814 will allow for custom gain and DC threshold adjustment. It is possible to have one intermediate stage drive multiple transistors. In one embodiment, intermediate stage 825 may be coupled to resistor 826 ("R1"), potentiometer 827 (i.e., variable resistor "RP1"), potentiometer 828 (i.e., variable resistor "RP2"), and resistor 829 ("R2"). R1 and RP1 form a voltage divider for the voltage presented at the input of side of R1. This voltage may include an AC component (i.e., a waveform) as well as a DC component (i.e., an offset). In other embodiments, the input voltage to R1 can be generated by a microprocessor in conjunction with a digital to analog ("D/A") converter, a pulse width modulator and integrator combination, or equivalent technique. In the present embodiment, it is a function of Vac which drives the body terminal of transistor 810. By varying RP1, the resultant voltage across RP1 will vary as a result of the voltage divider action between R1 and RP1. Intermediate buffer stage 825 is configured as a voltage follower with a gain of unity. RP2 is used as a DC offset control. R2 may be included as an isolation resistor. An isolation resistor can be helpful in instances where the body to source capacitance, Cbs, is large enough to cause an instability of intermediate stage 825. Additionally, embodiments of the present invention may use the body to source capacitance of the FET in conjunction with R2 to form a low pass filter.

Figure 9:
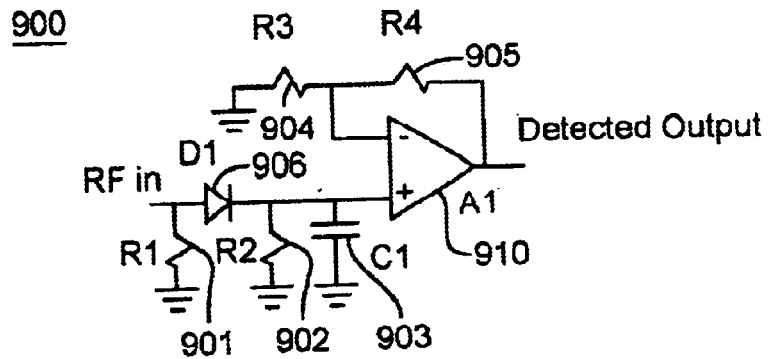
FIG. 9 illustrates an RF detector that may be used in one embodiment of the present invention.

FIG. 9 illustrates an RF detector 900 that may be used in one embodiment of the present invention. RF detector includes input resistor ("R1") 901, diode ("DI") 906, resistor 902, capacitor 903, amplifier 910, and gain setting resistors 904 and 905. The sensitivity of the detector may not be a critical factor in detection and the signal power available may be on the order of −20 dBm or higher. If the signal is much lower than −5 dBm it may become advisable to have an amplifier follow the detector (i.e., amplifier 910) to ensure that the detection process performance will not be noise limited.

R1 is used as a DC return path for D1 and can also be used as a load resistor for the source defined as RFin. D1 is a rectifier that has the peak voltage impressed across the combination of C1 and R2. R2 is used as a bleed resistor to discharge C1 when D1 is reversed biased. The time constant determined by R2 and C1 is a function of the response time desired of the detector. A1 is depicted here as a non-inverting amplifier whose gain is a function of R3 and R4. This function is $$1 + R4/R3$$

Figure 10:
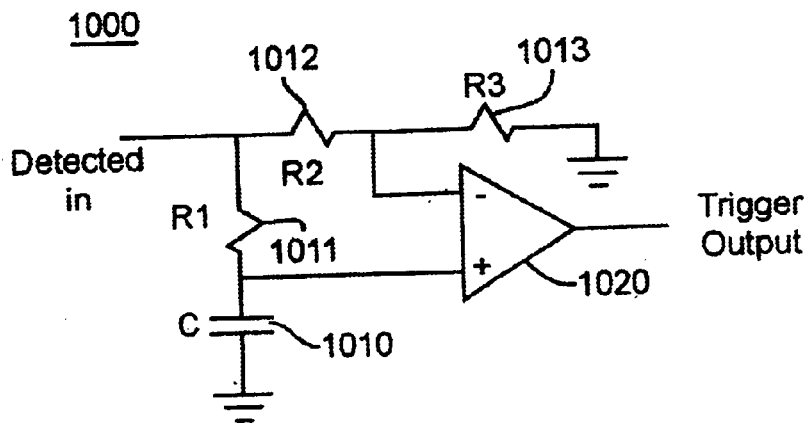
FIG. 10 illustrates a threshold detector according to one embodiment of the present invention.

FIG. 10 illustrates a threshold detector 1000 according to one embodiment of the present invention. The circuit includes a simple comparator circuit including resistors 1012 ("R2") and 1013 ("R3"), which form a voltage divider for attenuating the input signal. This ratio may be determined based upon the desired trigger threshold ratio between normal and high signal conditions. Resistor 1011 ("R1") and capacitor 1010 ("C") in FIG. 10 determine the integration time constant. This allows a running average of the input signal to set the trigger point. Whenever the divide input is greater than voltage on capacitor 1010 a high output condition will appear at the output of the comparator. Only when this attenuated signal exceeds the running average of the voltage across C will the comparator yield a high level. The high level will remain as long as this condition exists. The time constant of R1 and C should be long enough so that it will not be affected to any detrimental degree by the peak also being integrated. Resistor R3 could be connected to a adjustable voltage reference, for example, when multiple signal envelopes are being detected. The value of the reference would determine the level of the input signal envelope that will trigger the circuit. Of course, those skilled in the art will under stand that other comparator techniques could be used.

Figure 11:
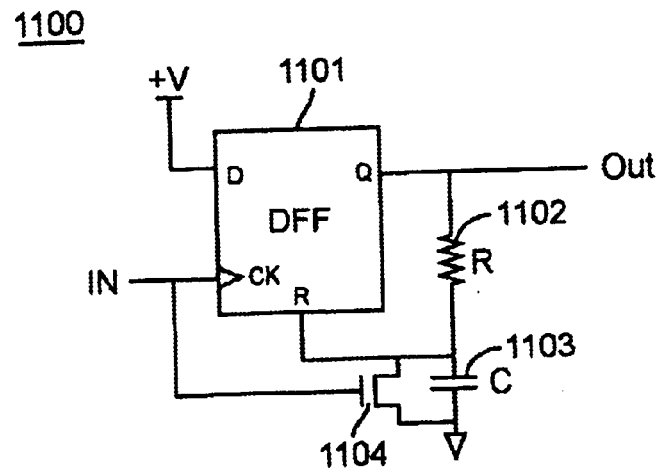
FIG. 11 illustrates a one-shot according to one embodiment of the present invention.

FIG. 11 illustrates a one-shot 1100 according to one embodiment of the present invention. One-shot 1100 includes a D-type flip flop ("DFF") 1101, feedback resistor 1102, timing capacitor 1103, and reset transistor 1104. One-shot 1100 receives a signal from threshold detector 1000 on the clock ("CK") input of DFF 1101. When DFF 1101 receives a signal on the clock terminal, the output ("Q") is set high (e.g., 5 volts) because the D input is tied to a high voltage (e.g., also 5 volts). When the Q output goes high, capacitor 1103 begins to charge through resistor 1102. After a period of time determined by the values of resistor 1102 and capacitor 1103 (i.e., the RC time constant), the reset input ("R") of DFF 1101 will reset the Q output back to a low state (e.g., 0 volts). One-shot 1100 may also include an transistor 1104 (e.g., MOS) so that when the trigger signal remains high before DFF 1101 has been reset (i.e., large envelope signal with long periods), one-shot 1100 will continue the pulse period by discharging capacitor 1103. As a result, the one-shot will increase the pulse width of the output.

Figure 12A:
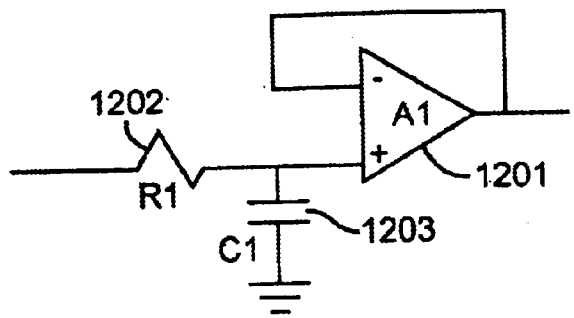
FIG. 12A illustrates a buffered integrator according to one embodiment of the present invention.

FIG. 12A illustrates a buffered integrator 1200 according to one embodiment of the present invention. The buffered integrator includes resistor 1202 ("R1") and capacitor 1203 ("C1"), which determine the corner frequency of the integrator. Amplifier 1201 ("A1") isolates the output circuit from the integrator so that it does not load the integrator and change the time constant determined by C1 and R1.

Figure 12B:
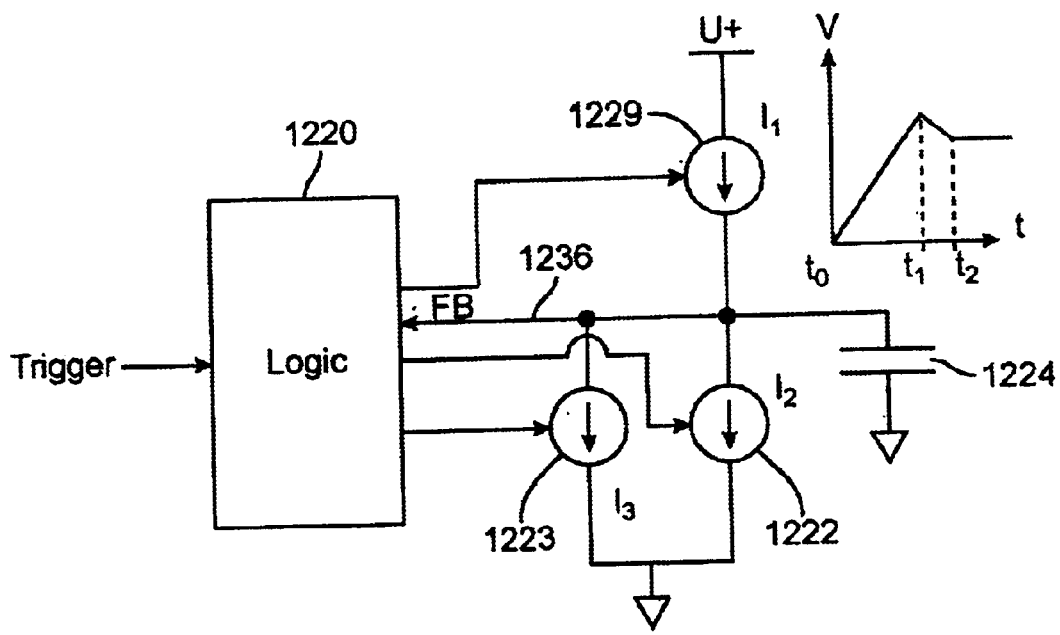
FIG. 12B illustrates a peak circuit according to one embodiment of the present invention.

FIG. 12B illustrates a peak circuit 1250 for implementing the peak feature discussed above. While there are many possible techniques for generating a peak on the control signal, peak generator circuit 1250 illustrates one approach that may be used. Peak circuit 1250 receives a trigger input from the output of one-shot 1100, and integrator 1200 is not used. Peak circuit 1250 includes logic 1250 for selectively controlling current sources 1221–1223. Current sources 1221 and 1222 are set to source/sink equal amouts of current. The current sources drive capacitor 1222 to generate the control signal. When the trigger is first received at t0, only current source 1221 is turned on by logic 1220. Thus, the voltage on capacitor 1224 increases in an approximately linear manner as determined by the capacitance and amount of current. After a predetermined period of time t1, logic circuit signals current sources 1222 and 1223 to turn on. Current sources 1222 and 1223 together sink more current than source 1221. Thus, the net current into capacitor 1224 is negative, and the voltage will decrease in an approximately linear manner. At time t2, logic 1220 signals current source 1223 to turned off. Therefore, capacitor 1224 receives a net zero current and the voltage is constant. When the trigger input returns to zero, logic 1220 turns current source 1221 off, and the voltage on capacitor 1224 will ramp down as current source 1222 sinks current. The same circuit could be used without current source 1223, if no peak is required. However, logic circuitry would have to turn on current source 1222 when the desired voltage level is achieved. An optional feedback signal ("FB") may be coupled from the output to logic circuit 1220 for monitoring the output voltage and controlling the current sources.

Figure 13:
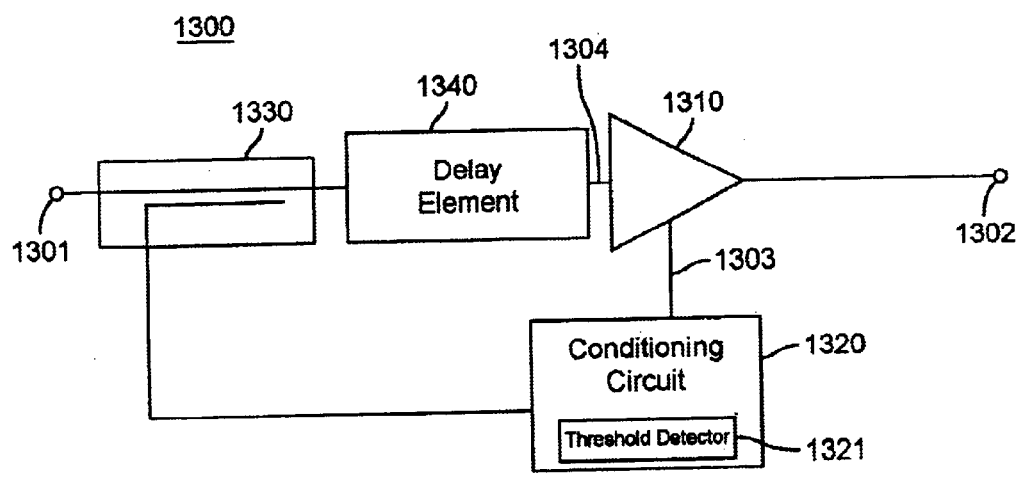
FIG. 13 illustrates an amplifier circuit according to another embodiment of the present invention.

FIG. 13 illustrates an amplifier circuit 1300 according to another embodiment of the present invention. Amplifier circuit 1300 includes an RF coupler 1330, delay 1340, RF amplifier 1310, and conditioning circuit 1320. The conditioning circuit 1320 receives a portion of the RF input signal received on amplifier input terminal 1301 and modifies the body bias voltage on terminal 1303 of RF amplifier 1320 before the input signal is received. In one embodiment, conditioning circuit 1320 includes a threshold detector 1321 that detects a change in the RF input signal envelope (e.g., a peak). In response to detecting a change in the input signal envelope, conditioning circuit 1320 generates a control signal for changing the body voltage terminal 1303 of the RF amplifier 1320 to change the bias current. The RF coupler 1330 couples a portion of the input signal into the conditioning circuit 1320. Delay 1340 is used to delay receipt of the input signal at the input 1304 of the affected MOS transistor in RF amplifier 1310. This delay will be a function of the time necessary for the conditioning circuit 1320 to change the bias current in the amplifier 1310. This is a trade-off between performance and physical size. The conventional way of delaying a signal is to use coaxial cable. There are more exotic methods such as high dielectric materials, silicon delay lines and bulk acoustic wave delay elements just to name a few. If a modulator were used in conjunction with this amplifier, and if it could predict when a peak would occur, this delay could be accomplished digitally, as described in more detail below.

Figure 14:
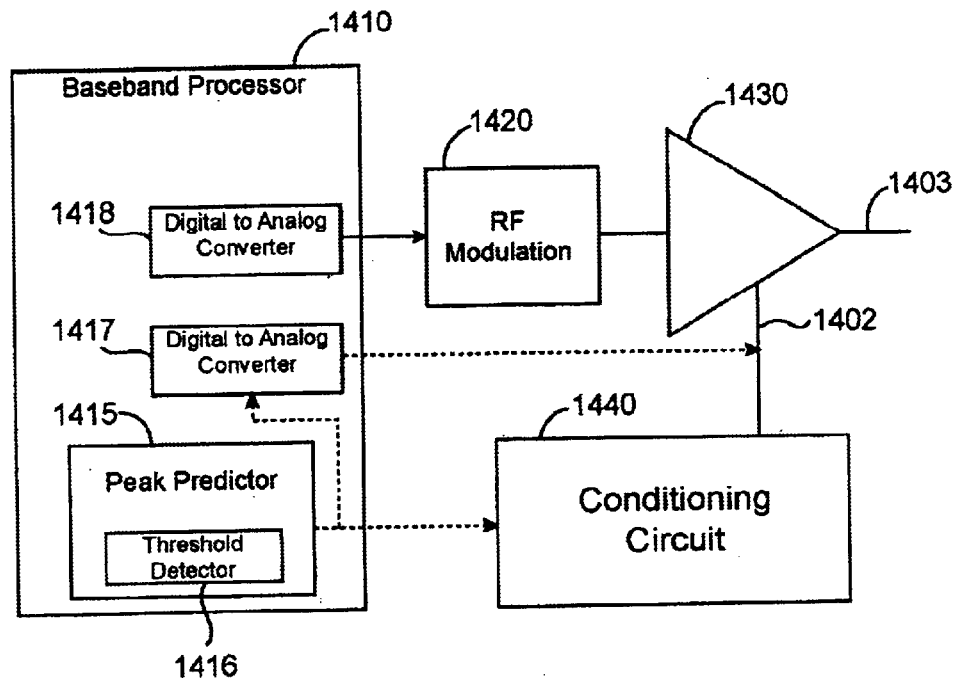
FIG. 14 illustrates an RF amplifier coupled to a wireless communication baseband processor having a peak predictor according to one embodiment of the present invention.

FIG. 14 illustrates an RF amplifier 1430 coupled to a wireless communication baseband processor 1410 having a body conditioning circuit including a peak predictor 1415 according to one embodiment of the present invention. The wireless system includes a baseband processor 1410, RF modulation block 1420, and RF amplifier 1430 as may be found in either a basestation or cell phone handset, for example. An attenuator (not shown) may also be placed in the signal path, such as prior to the RF amplifier 1430, so that gain compensation would be available if needed. Baseband processor 1410 may perform various digital processing for preparing communication data for transmission. Baseband processor 1410 may also include a digital-to-analog converter 1418 for generating output waveforms that are input to the RF modulation block 1420. RF modulation block 1420 may include one or more intermediate frequency modulation circuits for modulating the communication data to higher frequencies. The modulated signal is received at the input of the RF amplifier 1430, and the amplified signal is transmitted to output terminal 1403.

Baseband processor 1410 also includes a body conditioning circuit including peak predictor 1415. Peak predictor 1415 includes a threshold detector 1416 that monitors communication signals being processed for transmission by RF amplifier 1430 and generates a control signal coupled to control input 1402 of RF amplifier 1430 in response to detecting changes in the envelope of the signal. The peak predictor 1415 may comprise hardware, software (e.g., an algorithm), or a combination of hardware and software. In one embodiment, body conditioning circuit includes a peak predictor coupled directly to the control input terminal 1402. Thus, the baseband processor may control the RF amplifier directly (e.g., using a digitial-to-analog converter 1417). In another embodiment, a body conditioning circuit may include both a peak predictor 1415 residing on baseband processor 1410 and an external conditioning circuit 1440. Peak predictor may detect changes in the input signal envelope (e.g., a predicted peak in the RF input signal at the input of the RF amplifier 1430) from analyzing the baseband signals and send a signal to conditioning circuit 1440 to change the body bias of the RF amplifier 1430.

It is to be understood that a variety of circuits and methods may be used to generate a control signal at the body terminal of a MOS transistor in an amplifier for changing the bias current in the amplifier in accordance with a change in the envelope of the input signal. When the control signal is generated by a baseband processor in a communication system, peak detection algorithm 1415 may monitor the composite transmit signal's envelope and makes decisions based upon the results. Peak detection algorithm includes a threshold detector that can be implemented using analog or digital circuits. In the analog case, a analog detector may be used to follow the envelope of the signal of interest. In the digital implementation, a digital comparator may be used which would determine when a threshold has been crossed. For example, a digital peak detector may sample the input signal of a digital to analog converter and hold the largest value detected for a predetermined period of time or until a larger value is detected. If no larger value is detected after the predetermined period of time, it may be reset (e.g., to zero or the next input value).

In one embodiment, prediction is made possible because superposition applies in the case of multiple channels sharing the same spectrum simultaneously. This is the case with CDMA. In CDMA, a chip is the smallest unit of data for a particular spread spectrum transmission. The chipping rate for TIA standard IS-95, for example, is 1.2288 MHz. This means that a chip is approximately 814 ns. Even though the channels in a CDMA transmission are separated by their codes, the chips themselves are in phase since they share the same clock generator and the modulator local oscillators are phase coherent as well as at the same frequency. Therefore, the chip will determine the minimum period of coincidence between the channels of a particular state. A maximum will occur when all channels are time aligned and of the same polarity. Given that the probability of a coincidence of any two data channels is 0.5, the probability of a coincidence of all n channels is $0.5^{(n-1)}$. Therefore, if all of the channels were to be monitored simultaneously by a coincidence detector, included as part of the peak predictor, and delayed by at least one chipping cycle (e.g., 814 ns), an effective delay equal to a coax cable delay line of approximately 570 feet can be achieved. The coincidence detector may include a threshold level, which will determine when the peak predictor triggers an input signal to control input 1402 or body conditioning circuit 1440.

Peak predictor 1415 in baseband processor 1410 allows the body bias of a MOS transistor (or transistors) in RF amplifier 1430 to be modulated to allow signals over a certain predetermined threshold to pass through the transistor with a minimum of clipping, or distortion. In one embodiment, when the large envelope signal is received the body bias voltage may be changed to an arbitrarily large value which would allow a range of large envelope amplitudes to pass for a period when increased amplitudes are detected. Another way is to more closely follow the large envelope's value and make incremental adjustments to the body bias as required. A variety of useful amplitude detection circuits similar in nature to automatic gain control ("AGC") detection circuits may be used to generated a control signal for changing the body bias. Some AGC circuits also track the envelope of an input signal and make gain adjustments to the system to maintain linearity. However, in an AGC circuit the power handling capability is substantially fixed, and the input signal level is modulated in amplitude before the RF power amplifier output stage. On the other hand, embodiments of the present invention modulate the power handling capability of the RF power amplifier to accommodate changing envelopes of the input signal.

Figure 15:
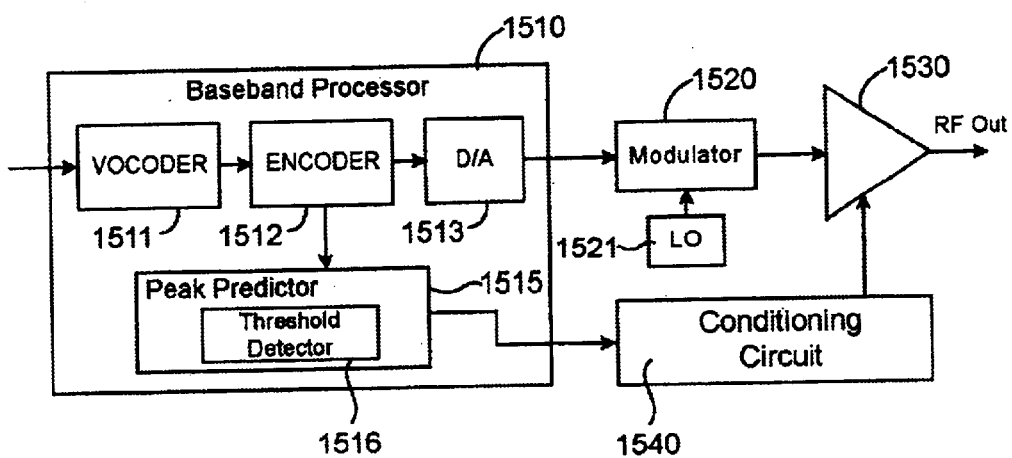
FIG. 15 illustrates an RF amplifier coupled to a wireless communication baseband processor having a peak predictor according to another embodiment of the present invention.

FIG. 15 illustrates an RF amplifier 1530 coupled to a wireless communication baseband processor 1510 having a peak predictor 1515 according to another embodiment of the present invention. In wireless communication applications, such as a mobile phone application, it is possible for a digital signal processor ("DSP"), or other type of baseband processor, to predict when a peak will occur. If baseband peak prediction is implemented it becomes unnecessary for a delay line to be used, since this delay may be generated digitally due to the predictor. Exemplarly baseband processor 1510 may include a VOCODER 1511 for implementing digital speech coding, such as compression, an ENCODER 1512 for performing such functions as CDMA, GSM, TDMA, or other wireless encoding techniques, a digital-to-analog converter 1513, and a peak predictor 1515. It is to be understood that VOCODER 1511, ENCODER 1512, and peak predictor 1515 may be implemented in a variety of ways including the use of a DSP, embedded processor, or ASIC. The output of the digital-to-analog converter 1513 is received by a modulator 1520. The modulator also receives a signal from a local oscillator 1521. The modulated signal is received at the input of RF amplifier 1530, and an amplified output RFout is generated at the output.

The baseband processor peak predictor 1515 receives a digital representation of the signal to be transmitted, such as, from the ENCODER 1512 (as shown), or alternatively, from the input of the D/A converter 1513, for example. Based on the signal to be transmitted, predictor 1515 predicts when changes in the signal envelope (e.g., peaks) will appear at the input of the RF amplifier 1530. A threshold detector, which may be digital or analog, detects the envelope of the signal. The peak predictor 1515 signals the conditioning circuit 1514 to alter the biasing of the RF amplifier 1530 when a peak is predicted in the signal. Different embodiments may include different partitioning of body conditioning circuitry (i.e., peak prediction 1515 and conditioning circuitry 1514) for generating the control input 1503. In one embodiment, the baseband processor may be coupled directly to control input 1503 for directly controlling the body terminal, for example.

Figure 16:
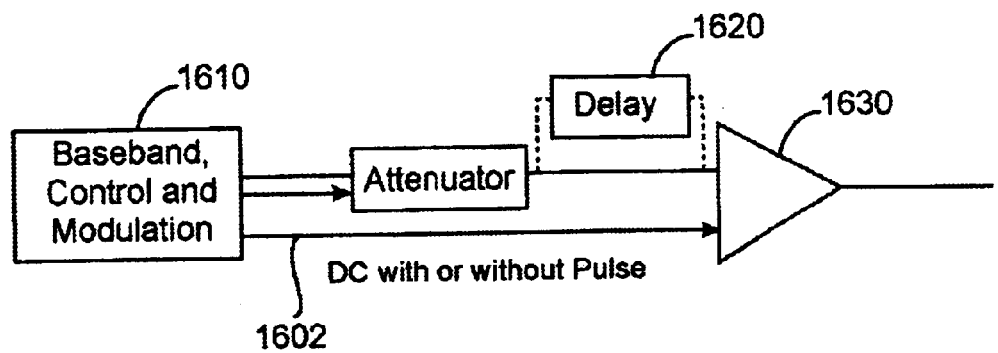
FIG. 16 illustrates an RF amplifier coupled to a wireless communication baseband processor according to another embodiment of the present invention.

FIG. 16 illustrates an RF amplifier 1630 coupled to a wireless communication baseband processor 1610 according to another embodiment of the present invention. In the circuit shown in FIG. 16, the body conditioning circuit may be integrated into the baseband 1610 or amplifier 1630. The control input terminal 1602 to amplifier 1630 may contain the body modulation signal (e.g., a pulse or control waveform) to control the power level of the amplifier. If a pulse is used, the DC level (i.e., the waveform level when the pulse is not present) may be determined by the power required for the lower power portion (e.g., small envelope) of the RF amplifier's input signal waveform which is present most of the time. If the baseband processor includes peak prediction, then delay 1620 may be used, but is not required, and accordingly, delay 1620 is shown connected to the signal path via a dashed line. However, if no peak prediction is used, delay 1620 may be placed in the signal path. Control input 1602 to control the bias of RF amplifier 1630, as well as any body conditioning circuits if used, are coupled upstream from delay 1620 (i.e., before the delay in the signal path). The input to RF amplifier 1630 is coupled to a signal downstream from delay 1620 (i.e., after the delay element in the signal path).

Figure 17:
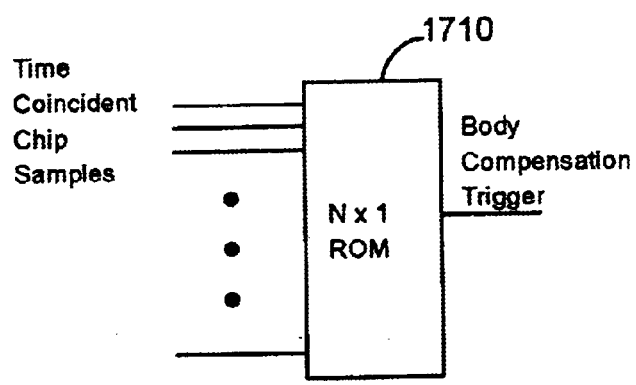
FIG. 17 illustrates a N×1 ROM that may be used in the baseband processor to control the biasing of an amplifier according to one embodiment of the present invention.

FIG. 17 illustrates a N×1 ROM 1710 that may be used in the baseband processor to control the biasing of an RF amplifier according to one embodiment of the present invention. According to one embodiment, peak prediction or a coincidence circuit can simply be a look up table, or read-only memory ("ROM"). The address may be the individual states of the chip stream of each channel being sampled coincidentally, and the output could simply be a "1" for compensation and a "0" for no compensation.

According to another embodiment, the modulation process is entirely accomplished digitally. This would mean that all modulated sources would ultimately pass through a digital-to-analog converter (DAC). A digital envelope detector may be used to detect the input to the DAC. ROM 1710 may be used to declare a change in the signal envelope, such as a peak. In this case, for an n-bit DAC, the threshold may be a digital word corresponding to the peak level of the DAC, for example. A digital delay, similar to a digital one shot, may be triggered. Any digital word exceeding the trigger word in the ROM may retrigger the one shot. This triggered period would extend past the last occurrence of a triggerable event by the period of the one shot.

Baseband envelope prediction and generation of the body modulation signal may not require a delay. This is because there is a priori knowledge of the required output power level for a given signal envelope. The control line to an attenuator can be either digital or analog in nature. If it is digital, then the gain steps will be discrete and dependent on the resolution of the attenuator. If it is analog, then there is a more continuous control available for the actual attenuation setting. It might also be desirable to have a digital control for coarse adjustment and an analog control for fine adjustments.

Thus, it can be seen that applications requiring power efficiency, linearity, or varying power levels will benefit from embodiments of the present invention. One such example is the mobile communication market. Whether you are dealing with high peak to average signals, like CDMA, or more benign peak to average modulation schemes, such as GSM or TDMA type waveforms, each modulation type can benefit. The high peak to average signal system needs to be able to modulate their output power as well as handle large occasional peak to average signals. More benign peak to average systems can benefit by saving battery life by only using enough power, RF and DC, needed to satisfy its intermodulation performance requirements. Embodiments of the present invention are applicable to both mobile and base station applications.

Figure 18:
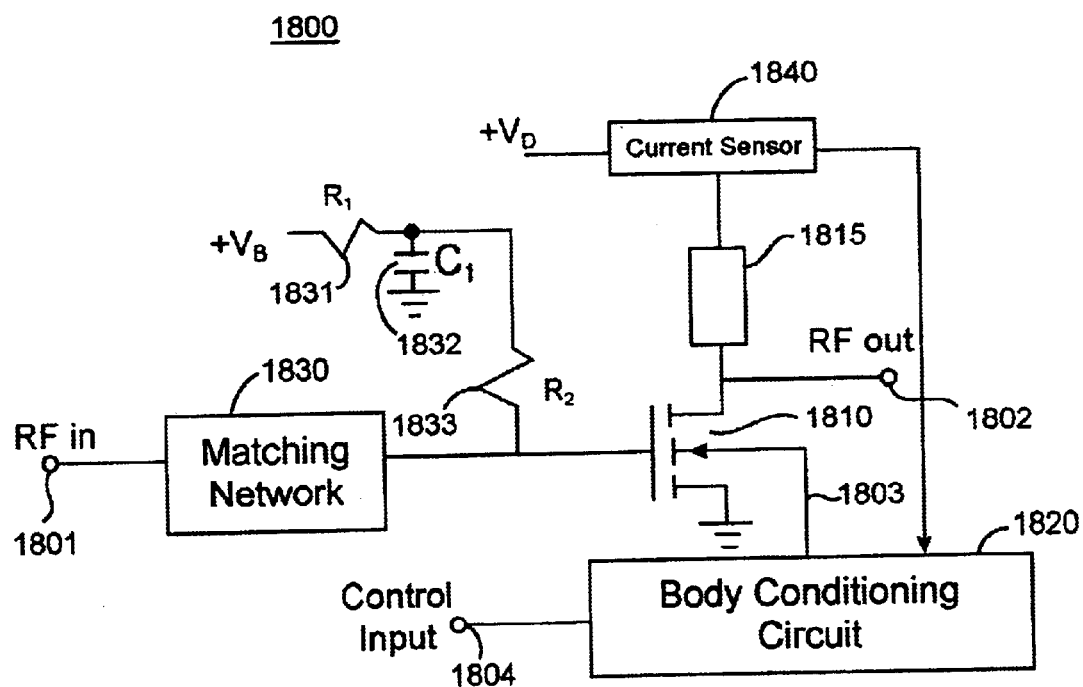
FIG. 18 illustrates an amplifier according to another embodiment of the present invention.

FIG. 18 illustrates an amplifier 1800 according to another embodiment of the present invention. Amplifier 1800 includes MOS transistor 1810 and load 1815. Load 1815 is coupled between the drain terminal of MOS transistor 1810 and power supply +V and may be a complex load Z(jω). According to the present embodiment amplifier 1800 further includes a gate bias network comprising resistor 1831 ("R1"), resistor 1833 ("R2"), and capacitor 1832 ("C1"), RF matching network 1830, and body conditioning circuit 1820. Body conditioning circuit 1820 receives an input signal, and in response thereto, generates a control signal on body control input terminal 1803 for altering the body voltage of MOS transistor 1810.

RF amplifier 1800 also includes threshold voltage compensation. One problem that may arise when using MOSFET amplifiers is that the threshold voltages tend to drift over time. It would be advantageous to have a method of compensating for any drift automatically. In addition, this would have a big impact on Class A amplifiers. Up until now the most popular method of compensation, gate bias adjustment, can have a detrimental effect on the input match, which is particularly important in RF amplifier applications. The configuration shown in FIG. 18 includes a technique for solving threshold drift problems. Current sensor 1840 monitors the steady state current to the MOS transistor 1810. A signal representative of the magnitude of the current through the sensor is sent to the body conditioning circuit, which has a fine body adjust capability added. R1, C1 and R2 will determine the class of amplifier. C1 is a reservoir capacitor as well as a low pass filter. The ratio of R1 and R2 will determine whether the amplifier is Class A or AB. As R1 approaches the magnitude of R2 the amplifier will become more Class A in operation. As R1 becomes much larger compared to R2, the circuit will become more Class AB in nature. The desired current may be set, and the loop will make sure that it is kept at that level.

Figure 19:
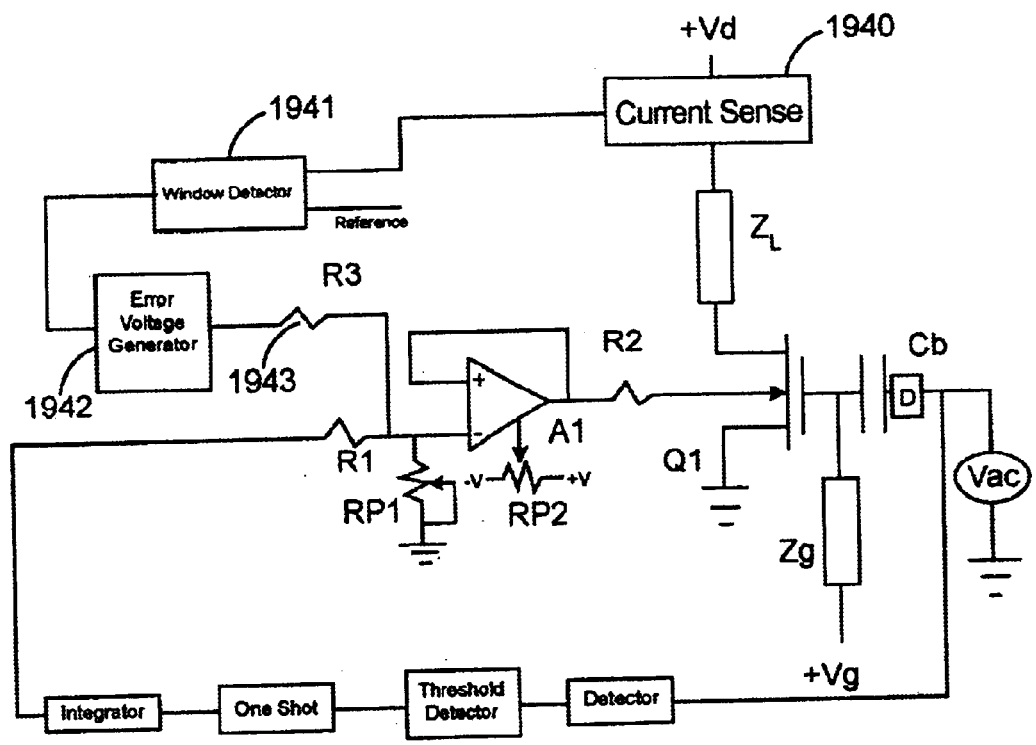
FIG. 19 illustrates an amplifier with threshold voltage compensation according to another embodiment of the present invention.

FIG. 19 illustrates an RF amplifier 1900 with threshold voltage compensation added to RF amplifier 800 according to another embodiment of the present invention. The current sense loop includes a window detector 1941 coupled to the current sensor 1940. The output of window detector 1941 is converted into an error voltage by error voltage generator 1942. A second input of the window detector receives a reference level. This reference level may be a current or voltage supplied by a source such as a D/A converter, a potentiometer, a switch, a pulse width modulator and integrator combination, or other equivalent technique. This would be advantageous in the mode where power adjustment is needed. One particularly useful application of this principle would be a conventional class A amplifier because such amplifiers are susceptible to MOS transistor threshold drift.

The window detector could be implemented in various ways. A window detector using two comparators is the most conventional way to achieve this. However, if this function were to be integrated into an available microprocessor, an A/D converter could digitize the feedback from the sensor and a D/A could generate the error voltage generator output. Other possible implementations for error voltage generator 1942 would be a charge pump in conjunction with an integrating capacitor/loop filter or even an electrically erasable potentiometer which is another form of D/A converter. Any appropriate summing circuit could be used which will allow for adding this error voltage into the control input to the body terminal. The output of error voltage generator 1943 is summed via summing resistor ("R3") 1943 with R1 and RP1. This causes an offset voltage to adjust the average DC level which will determine the quiescent drain current through MOSFET 1910. Components in the summing network (e.g., R3, RP1, and/or RP2) may be selected to ensure that the body potential is set to a value such that even with maximum correction the body to source junction of MOSFET 1910 (or the body to channel junction of a MESFET) is never forward biased.

Figure 20:
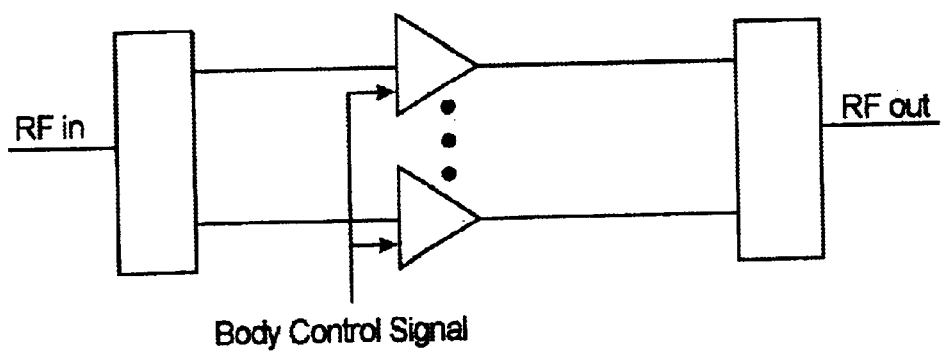
FIG. 20 illustrates a high power RF amplifier configuration according to another embodiment of the present invention.

FIG. 20 illustrates a high power RF amplifier configuration according to another embodiment of the present invention. For higher power amplifiers it is often necessary to increase the actual power delivery capability of the amplifier as a whole. Thus, in one embodiment, a number of stages are combined to deliver more power. A common control signal for all of the power amplification stages may be used to control the biasing of the amplifiers used. In other embodiments, a conditioning circuit may generate a number of different control signals tailored for each amplifier for controlling the biasing with more precision.

Figure 21:
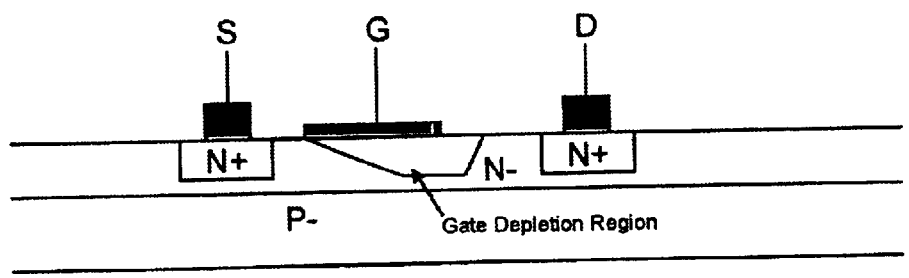
FIG. 21 illustrates a MESFET transistor structure for use in an amplifier according to one embodiment of the present invention.

FIG. 21 illustrates a Metal Semiconductor Field Effect Transistor (MESFET) transistor structure for use in an amplifier according to one embodiment of the present invention. MESFET transistors that may be used in embodiments of the present invention include GaAs, InP, SiC, or other III-V type devices, for example. Embodiments of the present invention may also utilize MESFET transistors by establishing a separate connection to the body material under the gate, e.g., the P– material. However, there are some differences between a MOSFET's operation, which is typically enhancement mode, and a MESFET, which is typically depletion mode. In the MOSFET, the channel characteristics, except for the threshold voltage are basically independent of the body voltage. In the MESFET depicted in FIG. 21, any depletion from the body will affect the source resistance, and therefore, the transconductance. This effect can be minimized by various processing techniques. One such technique would be to recess the gate.

Figure 22:
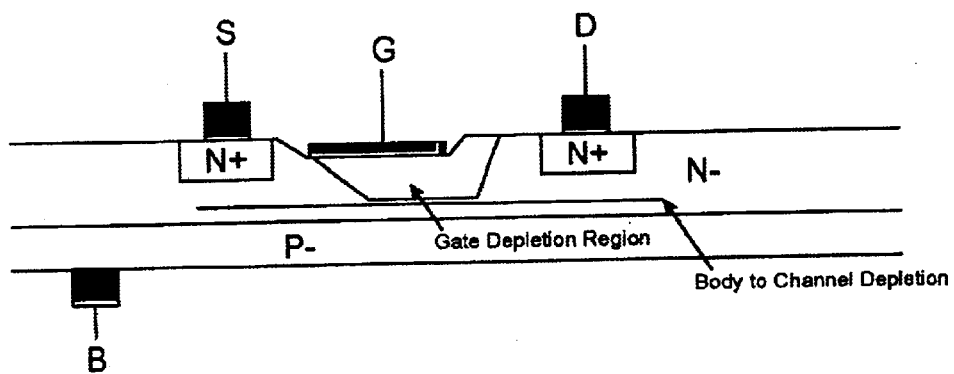
FIG. 22 illustrates a MESFET transistor structure with a recessed gate for use in an amplifier according to another embodiment of the present invention.

FIG. 22 illustrates a MESFET transistor structure with a recessed gate for use in an amplifier according to another embodiment of the present invention. A recessed gate may be advantageous for allowing the body to operate on the area under the gate closest to the drain, where tighter control of the current can be achieved. This approach may not be as predictable as the MOSFET approach, since doping profiles and process parameters will have a definite effect on the outcome of each device. Since there is no oxide to contend with, it is possible to get better matching of I-V characteristics. It should be noted that embodiments utilizing a MESFET can benefit from the teachings above in the MOSFET applications.

Having fully described alternative embodiments of the present invention, other equivalent or alternative techniques will be apparent to those skilled in the art. These equivalents and alternatives along with the understood obvious changes and modifications are intended to be included within the scope of the present invention as defined by the following claims.

What is claimed is:

1. An amplifier circuit comprising:
   a transistor having a gate terminal, drain terminal, and body terminal;
   a load coupled to the drain terminal of the transistor;

an input signal coupled to the gate terminal, the input signal including a first signal envelope during a first time period and a second signal envelope during a second time period;

a control signal coupled to the body terminal, the control signal including a first signal portion that sets a first voltage on the body terminal and a second signal portion that sets a second voltage on the body terminal, wherein the control signal is synchronized in time with the input signal so that the first signal portion occurs during to the first signal envelope, and the second signal portion occurs during to the second signal envelope.

2. The amplifier circuit of claim 1 wherein the load includes an inductor.

3. The amplifier circuit of claim 2 wherein the control signal to ramp up the amplifier current in an approximately linear manner.

4. The amplifier circuit of claim 3 wherein the control signal includes a peak between the first voltage and the second voltage.

5. The amplifier circuit of claim 1 wherein the first signal envelope is zero and the first signal portion sets a first voltage to reduce or completely shut off the bias current in the amplifier.

6. The amplifier circuit of claim 5 wherein the input signal further comprises a third signal envelope and the control signal further comprises a third signal portion that sets a third voltage on the body terminal.

7. The amplifier circuit of claim 1 wherein the transistor is an N-channel MOS transistor and the second voltage is at a higher potential than the first voltage.

8. The amplifier circuit of claim 1 wherein the transistor is an P-channel MOS transistor and the second voltage is at a lower potential than the first voltage.

9. An amplifier circuit comprising:
an amplifier input terminal for receiving an input signal;
a transistor having a gate terminal, drain terminal, and body terminal, the gate terminal being coupled to the amplifier input terminal;
a load coupled to the drain terminal of the transistor;
a body conditioning circuit having an input coupled to the amplifier input terminal and an output coupled to the body terminal of the transistor, the body conditioning circuit including a threshold detector to detect an envelope of the input signal and generate a control signal to change the bias current in the amplifier in response to changes in the envelope of the input signal.

10. The amplifier circuit of claim 9 further comprising a delay coupled to the gate terminal of the transistor for delaying the input signal.

11. The amplifier circuit of claim 10 wherein the input signal is delayed by an amount of time greater than or about equal the time required for altering the bias current of the transistor from a first value to a second value.

12. The amplifier circuit of claim 9 wherein the input signal has a first envelope and a second envelope greater than the first envelope, and wherein the body modulation circuit detects a transition between the first envelope and the second envelope, and in accordance therewith, alters the bias current in the transistor.

13. The amplifier circuit of claim 9 wherein the control signal includes a first and second state, and wherein when the control signal is in the first state, the body modulation circuit generates an output voltage for setting a first bias current in the amplifier, and when the control signal is in the second state, the body modulation circuit generates a output voltage for setting a second bias current in the amplifier.

14. The amplifier circuit of claim 9 wherein the body conditioning circuit includes an RF detector.

15. The amplifier circuit of claim 9 wherein the body conditioning circuit includes a peak predictor.

16. The amplifier circuit of claim 9 wherein the body conditioning circuit includes a digital-to-analog converter.

17. The amplifier circuit of claim 9 wherein the threshold detector is a digital threshold detector.

18. The amplifier circuit of claim 9 wherein the threshold detector is a analog threshold detector.

19. A wireless communication system comprising:
a baseband processor for encoding a communication signal to be transmitted;
a modulator coupled to the baseband processor for receiving the encoded communication signal and generating an RF signal;
an RF amplifier coupled to the modulator for receiving the RF signal, the RF amplifier comprising a transistor and a load; and
a body modulation circuit having an input for receiving the encoded communication signal and an output coupled to a body terminal of the transistor.

20. The wireless communication system of claim 19 wherein the body conditioning circuit includes a threshold detector to detect an envelope of the RF signal and generate a control signal to change the bias current in the amplifier in response to changes in the envelope of the RF signal.

21. The wireless communication system of claim 19 wherein the baseband processor comprises a CDMA encoder.

22. The wireless communication system of claim 19 wherein the baseband processor comprises a GSM encoder.

23. The wireless communication system of claim 19 wherein the baseband processor comprises a TDMA encoder.

24. The wireless communication system of claim 19 wherein the transistor is a N-channel or P-channel MOS transistor.

25. The wireless communication system of claim 19 wherein the transistor is a MESFET transistor.

26. The wireless communication system of claim 19 wherein the load comprises an inductor.

27. The wireless communication system of claim 19 wherein the control signal has a first signal portion that sets a first voltage on the body terminal when the RF signal has a first envelope and the control signal has a second signal portion that sets a second voltage on the body terminal when the RF signal has a second envelope.

28. The wireless communication system of claim 19 wherein when the control signal is in a first state, the body modulation circuit generates a output voltage for setting a first bias current in the RF amplifier, and when the control signal is in a second state, the body modulation circuit generates a output voltage for setting a second bias current in the RF amplifier greater than the first bias current.

29. The wireless communication system of claim 19 further comprising a delay element, wherein the body modulation circuit is coupled to a signal upstream from said delay element and the RF amplifier is coupled to a signal downstream from said delay element.

30. The wireless communication system of claim 19 further comprising a peak predictor for generating the control signal to the body modulation circuit when a change in the signal envelope is predicted.

31. A method of controlling an amplifier comprising:
  receiving an input signal at the gate terminal of at least one MOS transistor, the input signal including a first signal envelope during a first time period and a second signal envelope during a second time period;
  receiving a control signal at the body terminal of the at least one MOS transistor, the control signal including a first signal portion that sets a first voltage on the body terminal and a second signal portion that sets a second voltage on the body terminal,
  wherein the control signal is synchronized in time with the input signal so that the first signal portion corresponds to the first signal envelope, and the second signal portion corresponds to the second signal envelope.

32. The method of claim 31 further comprising delaying the input signal.

33. The method of claim 31 detecting a change in the envelope of the input signal.

34. The method of claim 33 wherein the detecting is executed digitally in a peak predictor.

35. The method of claim 33 wherein the detecting uses an RF detector.

36. A method of controlling the transmission of a signal comprising:
  sensing the amplitude of a signal to be transmitted;
  generating a control signal indicating that the amplitude of the signal to be transmitted has changed;
  receiving the signal to be transmitted at the gate of at least one transistor; and
  changing the body voltage of the transistor from a first voltage to a second voltage.

37. The method of claim 36 wherein the body voltage changes so that that current in the transistor changes in an approximately linear manner.

38. The method of claim 36 further comprising delaying the input signal.

39. The method of claim 36 wherein the sensing comprises digitally detecting the amplitude of the signal to be transmitted.

40. The method of claim 36 wherein the sensing comprises detecting the amplitude of the signal to be transmitted using an analog comparator.

41. In a wireless communication system, a method of transmitting a signal comprising:
  encoding a signal in a baseband processor;
  modulating the encoded signal to produce an RF signal; and
  amplifying the signal in an RF amplifier, the amplifier including a transistor and a load;
  wherein, when the RF signal has a first envelope, a body terminal of the transistor is biased to a first voltage, and when the RF signal has a second envelope, the body terminal of the transistor is biased to a second voltage.

42. The method of claim 41 further comprising:
  detecting the envelope of the RF signal; and
  generating a control signal for altering the body terminal voltage when the envelope of the RF signal crosses a predetermined threshold.

43. The method of claim 42 wherein the detecting is executed digitally in a peak predictor.

44. The method of claim 42 wherein the detecting uses an RF detector.

45. The method of claim 41 further comprising delaying the RF input at the RF amplifier.

* * * * *